(12) United States Patent
Itsuji (10) Patent No.: US 7,884,764 B2
(45) Date of Patent: Feb. 8, 2011

(54) ACTIVE ANTENNA OSCILLATOR

(75) Inventor: Takeaki Itsuji, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 876 days.

(21) Appl. No.: 11/802,113

(22) Filed: May 21, 2007

(65) Prior Publication Data

US 2007/0279143 A1    Dec. 6, 2007

(30) Foreign Application Priority Data

May 31, 2006  (JP)  .............................. 2006-150922
Nov. 1, 2006  (JP)  .............................. 2006-297307

(51) Int. Cl.
*H01Q 1/38*  (2006.01)
(52) U.S. Cl. .............................. 343/700 MS
(58) Field of Classification Search .......... 343/700 MS, 343/778, 846; 331/107 DP, 185
See application file for complete search history.

(56) References Cited

U.S. PATENT DOCUMENTS 3,778,717 A * 12/1973 Okoshi et al. ................ 455/129
6,091,373 A *  7/2000 Raguenet ..................... 343/778
2007/0215810 A1   9/2007 Kurosaka et al. .......... 250/358.1
2007/0252992 A1  11/2007 Itsuji .......................... 356/369
2007/0279136 A1  12/2007 Koyama et al. ............. 331/107

OTHER PUBLICATIONS

Lin, J. et al., "Two-Dimensional Quasi-Optical Power-Combining Arrays Using Strongly Coupled Oscillators." IEEE Transactions on Microwave Theory and Techniques, vol. 42, No. 4, pp. 734-741. Apr. 1994.

* cited by examiner

*Primary Examiner*—Michael C Wimer
(74) *Attorney, Agent, or Firm*—Fitzpatrick, Cella, Harper & Scinto

(57) ABSTRACT

An antenna oscillator includes a first strip line type resonator and a second resonator functioning as an antenna. The first resonator is fabricated by stacking a first conductor onto a grounding conductor with a first dielectric part including a gain part therebetween. The second resonator is fabricated by stacking a second conductor, emitting electromagnetic waves to the exterior, onto the first resonator with a second dielectric part therebetween so as to function as an antenna with the configuration between the grounding conductor and the second conductor. The first conductor and the second conductor are separated from each other in a stacking direction with the second dielectric part or the second dielectric part and the grounding conductor therebetween. The first resonator and the second resonator are electromagnetically connected together so as to form a resonance circuit that makes the electromagnetic waves resonate.

11 Claims, 10 Drawing Sheets

ACTIVE ANTENNA OSCILLATOR

BACKGROUND OF THE INVENTION

1. Field of the Invention

The present invention relates to active antenna oscillators, and in particular relates to an oscillator made by integrating an antenna with a gain medium. In more detail, the invention relates to an oscillator having an integrated structure emitting high-frequency (30 GHz to 30 THz) electromagnetic waves ranging from millimeter waves to terahertz waves.

2. Description of the Related Art

Recently, non-destructive inspection techniques have been developed using high-frequency electromagnetic waves (may also be called as terahertz waves in the specification) with an arbitrary band wavelength selected from millimeter waves to terahertz (30 GHz to 30 THz) waves. The terahertz waves are known to have absorption lines for absorbing various substances such as biological molecules. The field of application of this frequency range includes an imaging technique that is a safer inspection than the use of X-rays. It also includes a spectral technique for inspecting a molecule integrated state by obtaining an absorption spectrum and a complex dielectric constant in a substance. Moreover, an analytical technique of biological molecules and a technique for estimating a carrier density and mobility are expected.

In these development techniques, the generating technique of terahertz waves is important. The generating technique includes a photoconduction element having a femtosecond laser excitation source and a parametric oscillator having a laser excitation source and using a non-linear optical crystal. There are also a backward wave oscillator (BWO) and a gyrotron oscillator both including a large electron beam accelerator, such as a small electron tube and free electron laser. However, these oscillators utilizing the generating techniques generally have a large device scale.

On the other hand, there are small oscillators utilizing semiconductor techniques, such as a Gunn diode and a resonant tunneling diode (RTD). These oscillators utilize a negative differential resistance (NDR) obtained by the movement or transition of the electron in the semiconductor due to the electric current injection. The oscillation state is achieved by configuring the oscillating circuit including these semiconductor elements as well as by appropriately adjusting the load resistance and the phase in regard to a desired frequency region.

The electromagnetic waves obtained in such a manner may be frequently radiated outwardly by coupling the waves to a radiation device such as an antenna. However, in the high-frequency region, it is difficult to outwardly radiate the electromagnetic waves efficiently because of the propagation loss of the electromagnetic waves and the mismatching between individually designed elements. Then, the antenna element is assumed to be part of the load resistance constituting an oscillating circuit, so that the integral designing and building up have been attempted (see IEEE Transaction on Microwave Theory Tech., vol. 42, pp. 734 to 741, 1994).

The above non-patent document relates to a micro-strip line (MSL) type antenna oscillator in that a patch antenna is connected to a Gun diode formed in the film thickness direction of a dielectric part constituting the micro-strip line. In this antenna oscillator, the patch antenna is used as part of a load resistance for satisfying the oscillation start conditions in equations (1) and (2) shown below. In order to satisfy phase conditions, a phase adjusting stub is used. The patch antenna and a circuit constituted of another strip line are connected together with an impedance conversion circuit. The antenna oscillator has a planar accumulated configuration as a whole.

$$\text{Impedance real part Re: } [Y_{act}+Y_{load}]<0 \quad (1)$$

$$\text{Impedance imaginary part Im: } [Y_{act}+Y_{load}]=0 \quad (2)$$

In equations (1) and (2), "$Y_{act}$" and "$Y_{load}$" correspond to an admittance of a gain element (Gun diode) and an admittance of a strip line type oscillation circuit including an antenna, respectively. In this specification, a system, in which a circuit including a part having an electromagnetic wave gain function like a Gunn diode and an antenna are arranged or accumulated, is called as an active antenna. In such active antennas, the active antenna designed and manufactured as an oscillator is often called an active antenna oscillator.

In the related art described above, the oscillating circuit including the antenna is connected to a gain part in parallel therewith to form an oscillator. In a high-frequency circuit, with decreasing wavelength, the scale of the circuit is generally reduced. As a result, it becomes difficult to apply a sufficient load resistance to the antenna element used as part of the load resistance. More specifically, with decreasing wavelength, the value of resistance of the antenna element is reduced. Since the antenna element is connected to the gain element in parallel therewith, in accordance with the decrease in value of resistance of the antenna element, the value of "$Y_{load}$" is increased. Consequently, in the terahertz wave region, it becomes difficult to satisfy the impedance real part condition (1), so that the oscillator operation is liable to be unstable. Also, depending on the wavelength, the oscillation itself is difficult.

In regard to the waveguide, the propagation loss of electromagnetic waves due to the effect of the boundary surface to the metal is increased in the terahertz wave region. Thus, when a strip line is in heavy usage for an impedance conversion circuit and the phase matching as in the related art described above, the propagation loss of electromagnetic waves becomes large, which may result in deteriorating the generating efficiency of the electromagnetic waves.

SUMMARY OF THE INVENTION

An antenna oscillator according to the present invention includes a first strip line type resonator and a second resonator functioning as an antenna. The first strip line type resonator is fabricated by stacking a first conductor onto a grounding conductor defining a reference potential of each part with a first dielectric part therebetween, the first dielectric part having a gain part with a gain over electromagnetic waves to be oscillated. The second resonator is fabricated by stacking a second conductor, emitting electromagnetic waves to the exterior, onto the first resonator with a second dielectric part therebetween so as to function as an antenna with the configuration between the grounding conductor and the second conductor. The first conductor of the first resonator and the second conductor of the second resonator are separated from each other in a stacking direction with the second dielectric part or the second dielectric part and the grounding conductor therebetween. The first resonator and the second resonator are electromagnetically connected together so as to form a resonance circuit that makes the electromagnetic waves resonate. In such a manner, the active antenna oscillator according to the present invention is configured by arranging or forming a circuit including an electromagnetic gain function part and an antenna so as to operate typically in the terahertz wave region. Typically, the second resonator functioning as an antenna operates in the vicinity of the resonance wavelength of the first resonator. Components constituting the resonators are formed at desired positions so as to electromagnetically connect the first resonator to the second resonator. In some cases, the first conductor of the first resonator and the second conductor of the second resonator may also be connected with an adjustment conductor composed of one or a plurality of conductors.

A manufacturing method for manufacturing the antenna oscillator according to the present invention includes the steps of monitoring the oscillation state of the active antenna oscillator; and adjusting components of the first resonator and the second resonator so as to satisfy desired oscillation conditions while monitoring the oscillation state. When the adjustment conductor is used, the manufacturing method includes the steps of exposing an end face of the adjustment conductor from the boundary surface of the second dielectric part; and arranging the second conductor using the end face as an alignment marker.

The antenna oscillator according to the present invention is configured by electromagnetically connecting the first resonator having the gain part to the second resonator functioning as an antenna. Hence, the load resistance of the antenna to the gain part can be sufficiently ensured, facilitating to satisfy oscillating conditions. Therefore, the oscillator of the invention can provide comparatively stable oscillation. When the first conductor of the first resonator and the second conductor of the second resonator are connected together with the adjustment conductor, the adjustment conductor is added as an inductor component, improving the degree of freedom in matching the phase. Also, the adjustment conductor can be used as an alignment marker for arranging the second conductor of the second resonator functioning as an antenna, resulting in improved manufacturing yield.

Further features of the present invention will become apparent from the following description of exemplary embodiments with reference to the attached drawings.

DESCRIPTION OF THE EMBODIMENTS

Embodiments of the present invention will be described with reference to the drawings. In the drawings, like reference characters designate like components.

Figure 1A:
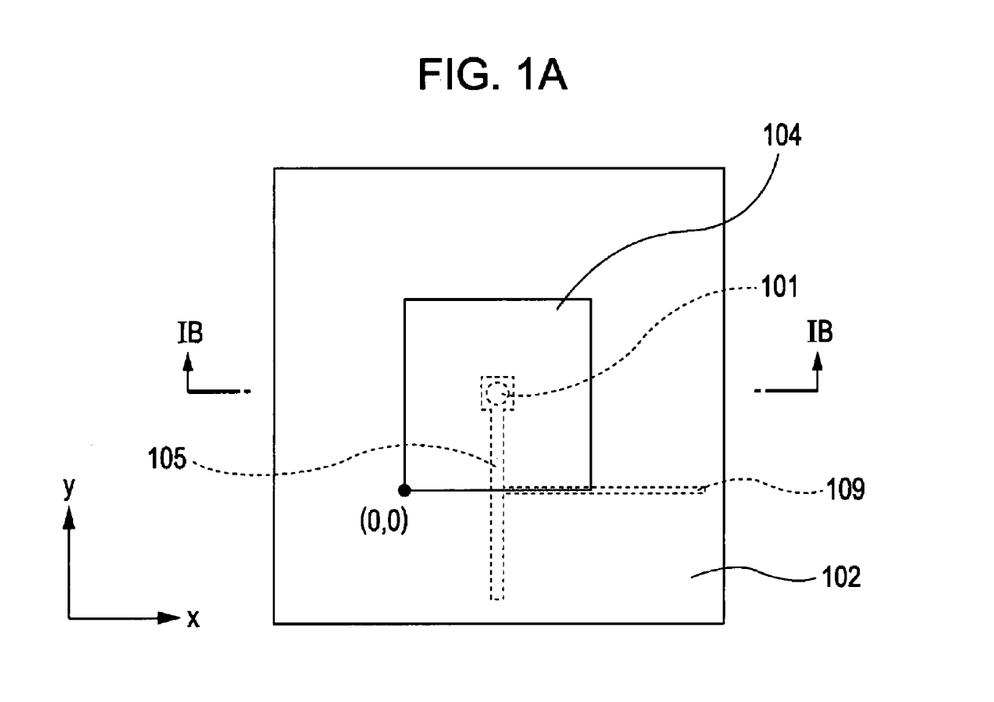
FIGS. 1A and 1B are drawings illustrating an example 1 of the present invention.
Figure 1B:
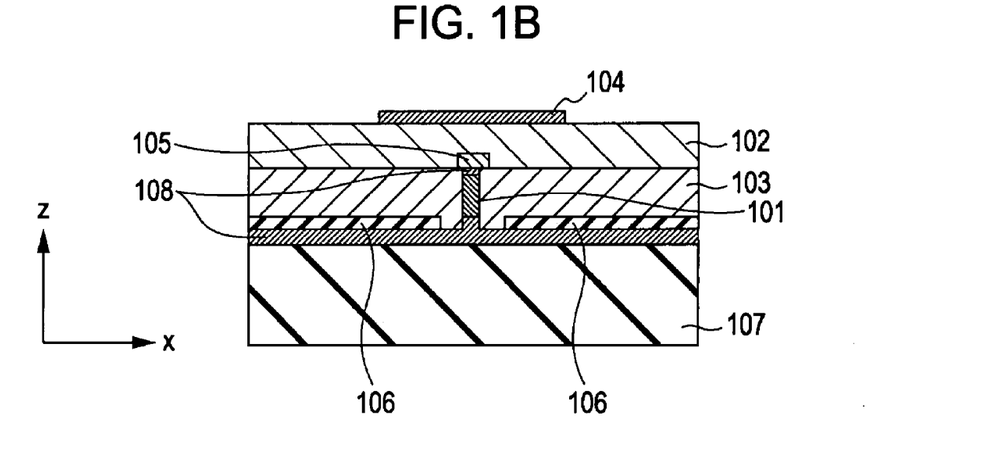

FIGS. 1A and 1B show a schematic configuration of an active antenna oscillator according to an embodiment, wherein FIG. 1A is a plan view and FIG. 1B is a sectional view at the broken line IB-IB'. According to the embodiment, X-, Y-, and Z-axis are defined as shown in FIGS. 1A and 1B. In particular, the longitudinal direction of a first conductor 105 is defined to be the Y-axis.

The active antenna oscillator according to the embodiment is mainly composed of two resonators. These resonators form one resonator circuit by the interaction with each other due to the electromagnetic coupling. However, these are divided into a first resonator and a second resonator to allow for convenient description.

Referring to FIGS. 1A and 1B, the first resonator includes a gain part 101, a first conductor 105, a grounding conductor 106 for defining a predetermined reference potential for each part, and a first dielectric part 103. As shown in FIGS. 1A and 1B, the first conductor 105 is an open stub type strip conductor and constitutes a waveguide together with the grounding conductor 106 and the first dielectric part 103. By such a configuration, electromagnetic waves transmitting along the waveguide are reflected by the end of the first conductor 105 so as to resonate with the wavelength due to the length of the first conductor 105, and the resonance circuit is thereby formed.

The gain part 101 is inserted between the first conductor 105 and the grounding conductor 106. The gain part 101 has a gain over some wavelengths of an RTD, a quantum cascade, and a Gunn diode. According to the embodiment, the RTD is used unless otherwise signified; however, the invention is not limited to the RTD. As shown in FIGS. 1A and 1B, one end of the gain part 101 is connected to the first conductor 105 while the other end is identical to the grounding conductor 106 in potential. The periphery of the gain part 101 is filled with the first dielectric part 103. In such a manner, the first resonator is configured so to satisfy oscillation starting conditions of the oscillator by adjusting the electromagnetic coupling.

The second resonator includes a second conductor 104, the grounding conductor 106, the first dielectric part 103, and a second dielectric part 102. As shown in FIGS. 1A and 1B, the second conductor 104 is square in shape, so that the second resonator may be assumed to be a patch-antenna resonance circuit functioning to outwardly emit electromagnetic waves with a wavelength corresponding to the resonance frequency. The shape of the second conductor 104 is not limited to be square, so that a circular or triangular shape may be adopted as long as it can work as an antenna. Also, the first dielectric part 103 and the optical disc 102 may be the same material, or furthermore, they may be gaseous like air.

Referring to FIGS. 1A and 1B, the first and second resonators are formed on a dielectric substrate 107, and reference numeral 108 denotes a contact layer of the gain part 101; numeral 109 a bias feed part for applying a bias to the gain part 101.

As shown in FIGS. 1A and 1B, according to the embodiment, the first resonator is formed over the second resonator by overlapping with the second resonator in the film thickness direction or in the stacking direction of each dielectric part. More specifically, the first resonator is arranged at a desired position directly under the second conductor 104 constituting the second resonator. The second conductor 104 is separated from the first conductor 105 constituting the first resonator with the dielectric part constituting the active antenna oscillator therebetween. The resonators can achieve electromagnetic coupling by arranging the resonators at positions where one resonator can affect the electromagnetic field distribution of the other resonator. The range of the positions affecting the electromagnetic field distribution herein means that the resonators are arranged within the range of regions having the electromagnetic field distribution with a peak value/$e^2$ or more.

In FIGS. 1A and 1B, when the first conductor 105 comes sufficiently close to the second conductor 104, for example, electromagnetic waves propagating through the first conductor 105 can be propagated to the second conductor 104. Namely, if the second dielectric part 102 is reduced in thickness, the dielectric film thickness can be sufficiently secured due to the film thickness of the first dielectric part 103. Thus, even in a high-frequency band, the dielectric film thickness of the second resonator, which is an antenna element, can be increased, so that a load resistance can be sufficiently applied to the gain part 101.

Figure 8:
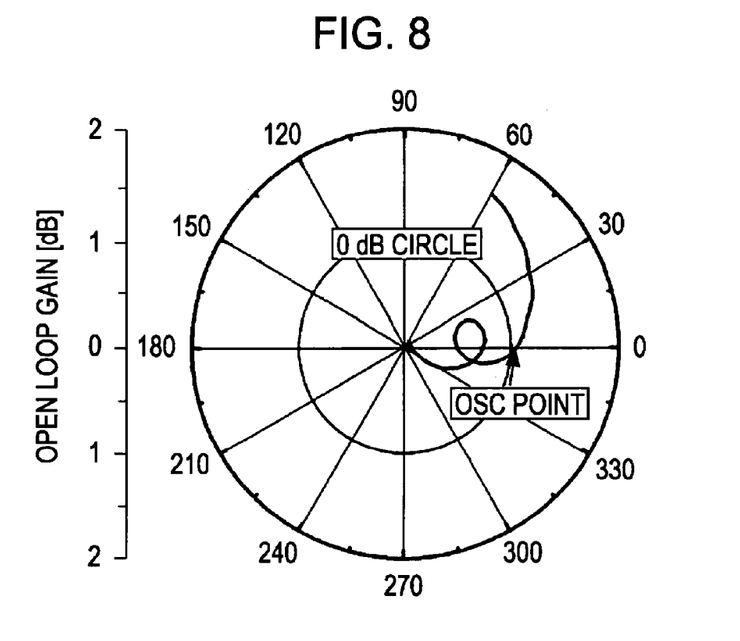
FIG. 8 is a drawing illustrating the relationship between the gain and the phase in the oscillator.

The electromagnetic coupling state is changed due to the relative position of the first resonator and the second resonator. For example, if it is assumed that a capacitive component be added between the first conductor 105 and the second conductor 104, with the relative position of the resonators, the capacitive component varies. That is, the phase state can be controlled. FIG. 8 is a polar coordinates graph about the electromagnetic gain and the phase. Referring to FIG. 8, in a frequency band with a gain of 0 dB or more and with a phase satisfying $2n\Pi$ (n=0, 1, 2 . . . ), the circuit starts oscillating. By integrally designing the relative position and shapes of the resonators so as to satisfy such oscillating conditions, the active antenna oscillator according to the embodiment can be oscillated.

The active antenna oscillator according to the embodiment described above forms an oscillator by electromagnetically coupling the first resonator having the gain part 101 with the second resonator functioning as an antenna. Since the antenna load resistance against the gain part 101 can be sufficiently ensured, the oscillating conditions are easily satisfied so that the oscillator can be stably oscillated.

In the active antenna oscillator according to the embodiment, the oscillating conditions are controlled with the electromagnetic coupling state of each resonator. Thus, by integrally designing and manufacturing the arrangement of each resonator so as to satisfy oscillating conditions, the phase adjustment circuit necessary in the past is eliminated, thereby reducing the circuit in scale and achieving a high-efficient oscillator by suppressing the propagation loss of electromagnetic waves because of the reduction in circuit scale.

The coupling state of the electromagnetic field can be controlled by the film thicknesses and the arrangement on the plane perpendicular to the stacking direction of the first and second dielectric parts 103 and 102 constituting the resonators. Therefore, in comparison with the conventional control method with the phase stub formed by vapor deposition, the phase conditions can be controlled with higher accuracy because of the control by the film thickness and the alignment of the mask used in forming each conductor.

The mask for process corresponding to the kind of the phase stub has been necessary for phase control; whereas, according to the embodiment, the phase can be controlled with the relative position of the resonators, so that the mask for forming an antenna is only needed, thereby reducing the number of masks as well as comparatively reducing cost.

EXAMPLES

Next, more specific examples will be described with reference to the drawings. An antenna oscillator according to the present invention is not limited to these examples.

Example 1

The example 1 is an example corresponding to the active antenna oscillator according to the embodiment described above. FIGS. 1A and 1B show the configuration of the active antenna oscillator according to the embodiment.

The first resonator in this example 1 includes the first conductor 105 formed on a dielectric substrate 107, the grounding conductor 106, the first dielectric part 103, and the gain part 101. That is, the first resonator is an MSL-type resonance circuit. The dielectric substrate 107 includes a semi-insulating substrate made of indium phosphide (InP). The first conductor 105 and the grounding conductor 106 include Au/Ti (gold (0.3 µm)/titanium (0.03 µm)). The line width of the first conductor 105 is 10 µm. The first dielectric part 103 is coated with benzocyclobutene (BCB) with a thickness of 3 µm.

The gain part 101 of the example 1 is made of an RTD. The gain part 101 includes an active layer having a triple-barrier quantum well structure hetero-joined by the use of InGaAs/InAlAs (indium gallium arsenide/indium aluminum arsenide). This active layer may be formed by epitaxially growing the dielectric substrate 107 with a molecular beam epitaxial method (MBE method). The active layer and the dielectric substrate 107 may be totally called as an epitaxial substrate below. The contact layer 108 is made of $n^+$InGaAs doped with high-concentration silicon (Si) stacked on the top and bottom of the active layer. By the contact layer 108, the gain part 101 achieves the conduction between the first conductor 105 and the grounding conductor 106.

In some cases, for ensuring the insulation of the grounding conductor 106, a semi-insulating part (the dielectric substrate 107) may be selectively removed by a grinding method and a wet etching method, for example, and then the grounding conductor 106 may be bonded on an insulating substrate.

The composition of the active layer in the example 1 is ranging from the first conductor 105 toward the grounding conductor 106 as follows: InGaAs (5.0 nm)/InAlAs (2.66 nm)/InGaAs (5.61 nm)/InAlAs (2.66 nm)/InGaAs (7.67 nm)/InAlAs (2.66 nm)/InGaAs (5.0 nm).

For applying a bias to the gain part 101, as shown in FIGS. 1A and 1B, a bias applying unit 109 is connected to the first conductor 105. The bias applying unit 109 herein includes a strip conductor made of Au (0.3 µm)/Ti (0.03 µm). Hence, the bias applying unit 109 also becomes an MSL-type waveguide. Since the bias applying unit 109 does not affect the other circuits, it is desirable to have high impedance, so that its small line width may be preferable. In order to minimize the effect on electromagnetic waves propagating through the first resonator, the connection point of the bias applying unit 109 may be favorably located at a nodal position of the electromagnetic field distribution (position where the electric field is zero).

The second resonator is fabricated by stacking the second dielectric part 102 and the second conductor 104 onto the first resonator in that order. The second dielectric part 102, in the same way as in the first dielectric part 103, is coated with the BCB. Also, the second conductor 104 is made of Au (0.3

μm)/Ti (0.03 μm) in a square shape. That is, the second resonator in the example 1 forms a patch antenna-type resonance circuit together with the grounding conductor 106, the first dielectric part 103, and the second dielectric part 102.

The fabrication method in the example 1 is not limited to these described above, so that the fabrication may also adopt known process techniques.

FIG. 8 is an example of the small signal analysis of the active antenna oscillator in the example 1. The analysis is obtained by combining an electromagnetic simulator with a high-frequency circuit simulator. As mentioned above, FIG. 8 is a polar coordinates graph showing the gain and phase in which the position where the gain is 0 dB under the phase condition $2n\pi$ is the oscillation starting point.

As described above, in the active antenna oscillator in the example 1, the above oscillating conditions are satisfied by controlling the relative position and shapes, i.e., the arrangement, of the resonators. The analysis examples regarding to the design are shown as follows.

Figure 5:
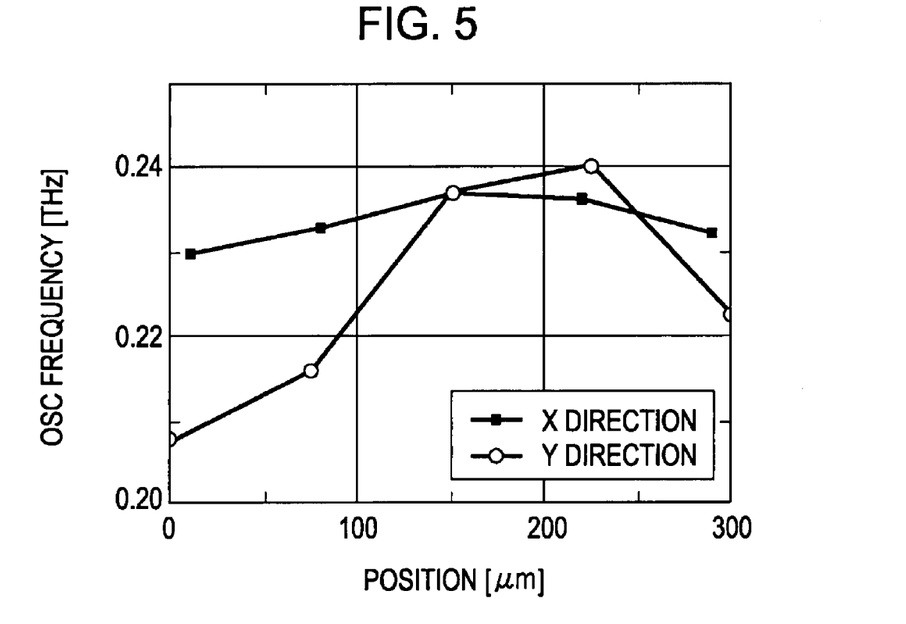
FIG. 5 is a drawing illustrating the operation of the oscillator in the example 1.

FIG. 5 is a graph of the oscillating frequencies when the relative position of the second conductor 104 is changed, which are plotted against the end position of the first resonator (in the example 1, the position of the gain part 101 shown in FIGS. 1A and 1B). The thickness of the second dielectric part 102 herein is 3 μm. The line length of the first conductor 105 is 300 μm. In FIG. 5, the end position of the first resonator shown in FIG. 1A is offset in the X-direction from starting points (0 μm and 150 μm). Similarly, the end position of the first resonator shown in FIG. 1A is offset in the Y-direction from starting points (150 μm and 0 μm).

From FIG. 5, it is understood that by changing the relative position of the first and second resonators in an in-plane direction, the phase matching condition can be changed so as to change the oscillating frequency. In particular, it is understood that the phase condition can be largely changed by the offset in the Y-direction. It is understood that the offset in the X-direction is suitable for the fine adjustment because of the small change rate of the oscillating frequency. From FIG. 5, it is also understood that the oscillating frequency is maximized when the end of the first resonator is located at positions in the vicinity of the center of the second conductor 104 (150 μm and 150 μm), i.e., at a position of $\lambda/4$ ($\lambda$=the resonance wavelength of the antenna (600 μm). Also, the analysis shows that the radiation efficiency of the active antenna oscillator in the example 1 is optimized when the end of the first resonator is located in the vicinity of this position.

Figure 6:
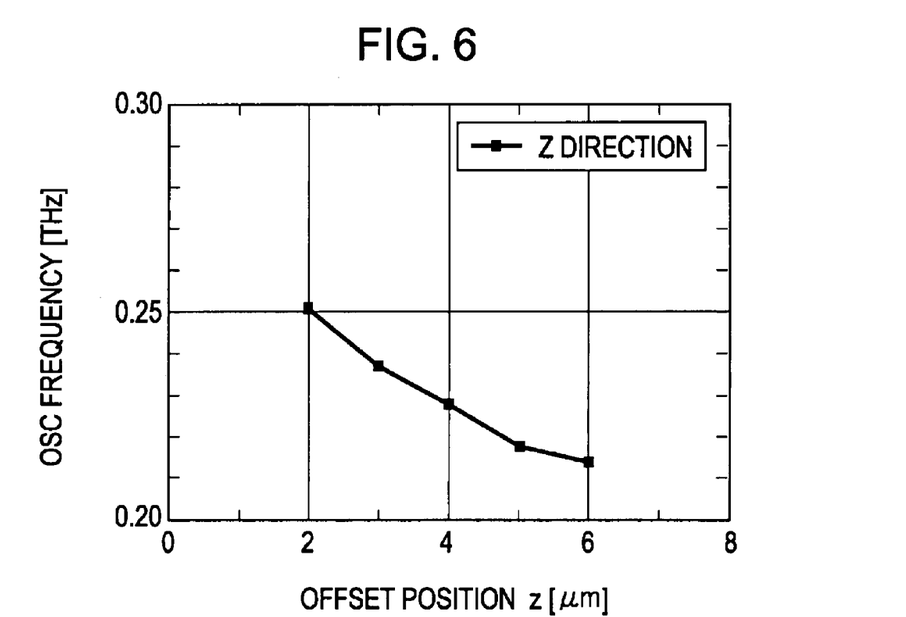
FIG. 6 is a drawing illustrating the operation of the oscillator in the example 1.

FIG. 6 is a graph of the plotted oscillating frequencies when the thickness of the second dielectric part 102 is changed in the film thickness direction. The end positions of the first resonator herein are 150 μm and 150 μm. The length of the first conductor 105 is 300 μm. In FIG. 6, the thickness of the second dielectric part 102 shown in FIGS. 1A and 1B is changed in the Z-direction.

From FIG. 6, it is understood that by changing the thickness of the second dielectric part 102, the integrated state of electromagnetic waves of the first and second resonators can be changed so as to change the oscillating frequency. In the thickness control of the second dielectric part 102, when the known thin-film forming technique is utilized, the fine control is capable on the order of nanometers. Hence, the oscillating condition can be controlled with high accuracies. The second resonator is fabricated by sequentially stacking the second dielectric part 102 and the second conductor 104 onto the first resonator, so that it is easy to remove the second dielectric part 102 and the second conductor 104. That is, if the fabrication of the oscillator failed, re-fabrication is facilitated.

In the system including the conventional phase stub, it is necessary to change the length of the phase stub for changing the phase condition. Thus, the mask needs to be prepared corresponding to the length of the phase stub. Whereas, in the example 1, when the phase condition is changed for exploring the oscillating condition, only the film thickness of the second dielectric part 102 need be changed. Namely, only one kind of mask is necessary for forming the second conductor 104, thus reducing cost.

In the example 1, the thickness of the second dielectric part 102 may be changed; alternatively, the thickness of the first dielectric part 103 may be adjusted depending on circumstances.

Figure 7:
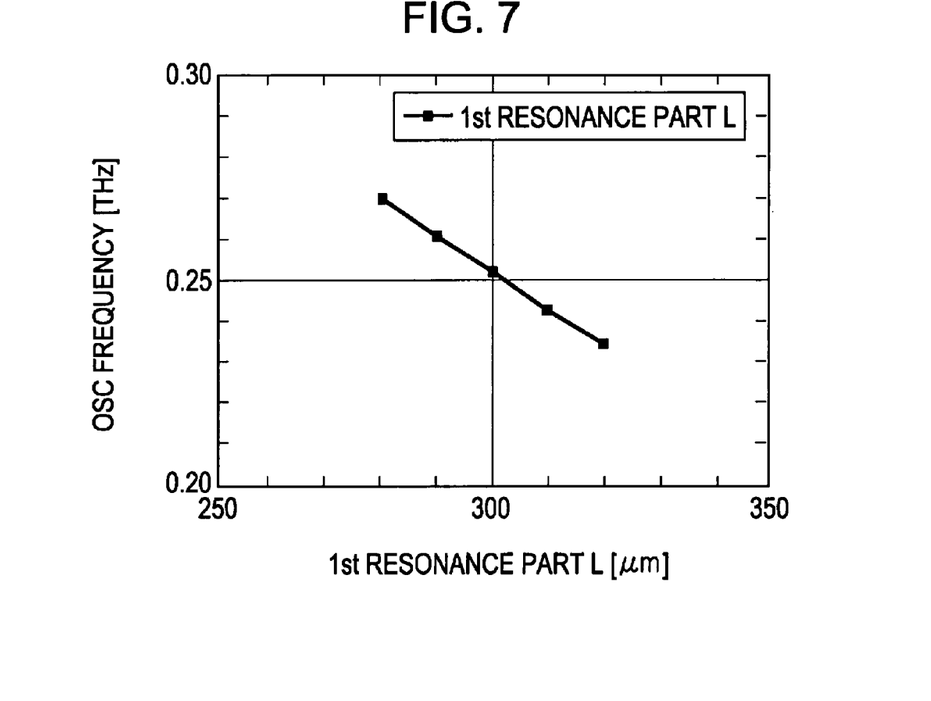
FIG. 7 is a drawing illustrating the operation of the oscillator in the example 1.

FIG. 7 is a graph of the plotted oscillating frequencies when the length of the first conductor 105 is changed. The end positions of the first resonator herein are fixed to 150 μm and 150 μm. The film thickness of the second dielectric part 102 is 2 μm.

Referring to FIG. 7, the length of the first conductor 105 is subtly changed relative to the length of the second conductor 104. In this case, it is understood that the oscillating frequency be substantially linearly changed against the change rate of the length of the first conductor 105.

In FIG. 7, the length of the first conductor 105 is changed; alternatively, the length of the second conductor 104 may be changed. In short, the length ratio of the first conductor 105 to the second conductor 104 may be changed.

In FIGS. 1A and 1B, the gain part 101 is arranged at the end of the first conductor 105; however, the position is not limited to this, so that it is also effective for controlling the oscillating condition to arrange the gain part 101 at an arbitrary position in the first conductor 105.

As described above, in the active antenna oscillator in the example 1, by controlling the relative position and shapes of the first resonator and the second resonator, the electromagnetically integrated state is controlled so as to satisfy the oscillating condition. Thus, the circuit for adjusting the phase, which has been necessary, becomes unnecessary, thereby providing a highly efficient oscillator by reducing the circuit scale so as to suppress the propagation loss of the electromagnetic wave.

In the active antenna oscillator in the example 1, components constituting the oscillator are separated from each other, so that if the fabrication of the second resonator is failed, re-fabrication is possible by removing the second dielectric part 102 and the second conductor 104. Namely, the fabrication cost and time can be reduced. Furthermore, the facilitation of the re-fabrication enables the components of the resonators to be adjusted so as to satisfy the target oscillating condition while the oscillating state of the product being observed during the fabricating. Hence, the re-fabrication may also have the effect of the increase in yield.

Example 2

An example 2 according to the present invention will now be described. In the example 2, one configuration of an electromagnetic connection method will be described. The description of parts duplicated with the example 1 is omitted.

Figure 2A:
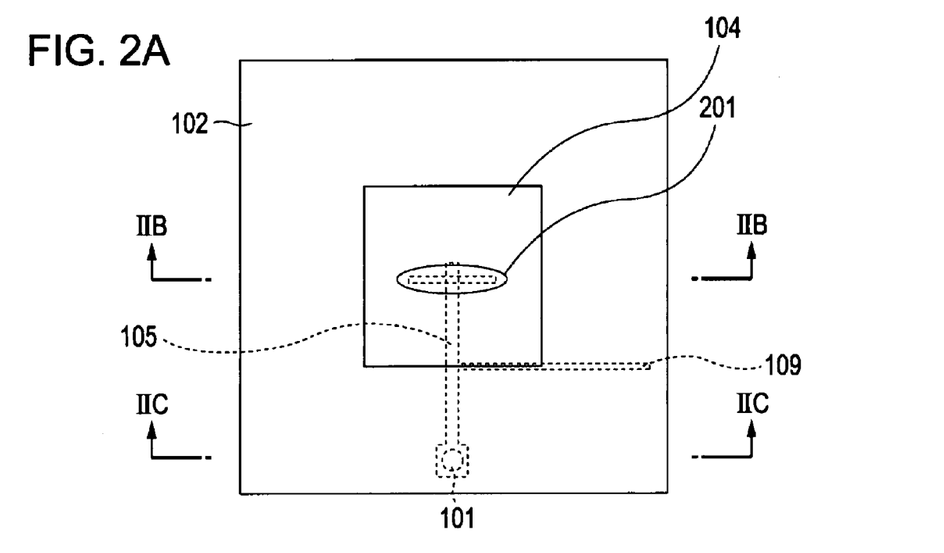
FIGS. 2A to 2C are drawings illustrating an example 2 of the present invention.
Figure 2B:
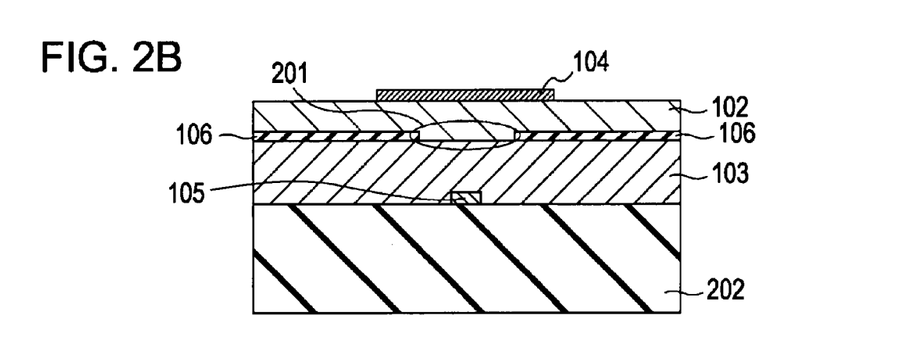
Figure 2C:
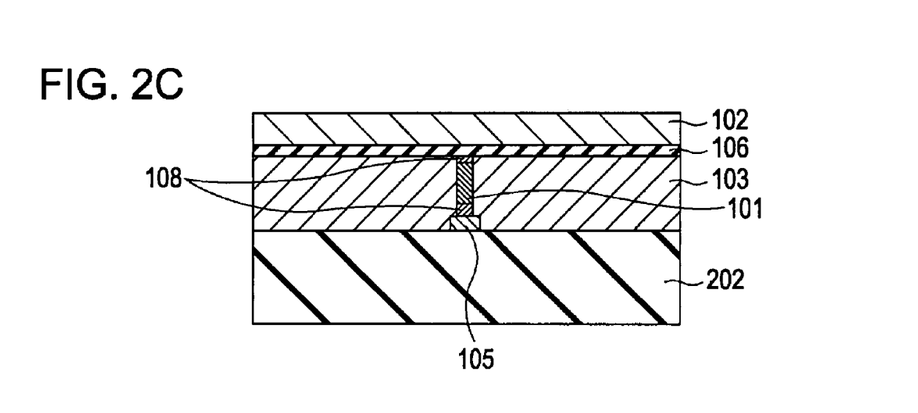

FIGS. 2A to 2C show the configuration of an active antenna oscillator in the example 2, wherein FIG. 2A is a plan view; FIG. 2B is a sectional view at the broken line IIB-IIB'; and FIG. 2C is a sectional view at the broken line IIC-IIC'.

In FIGS. 2A to 2C, the points different from the example 1 are that a slot part 201 is added to the grounding conductor 106 and that the resonators are connected together with the slot part 201 therebetween in the example 2, whereas in the example 1, the electromagnetic connection is achieved by making the first conductor 105 come close to the second conductor 104.

In the example 2, a semi-insulating part (corresponding to the dielectric substrate 107 in FIGS. 1A and 1B) is selectively removed from the epitaxial substrate to form the first conductor 105. Then, an insulating support substrate 202 is bonded on the first conductor 105 for ensuring the insulation of the first conductor 105.

In the example 2, by controlling the relative position and shapes of the first resonator and the second resonator, the electromagnetically integrated state can also be controlled. In the example 2, the gain part 101 is also arranged at the end of the first conductor 105; however, the position is not limited to this.

Like in the example 2, by controlling the electromagnetically integrated state through the slot part 201 within the grounding conductor 106, electromagnetic wave components generated at positions other than the slot part 201 are absorbed by the grounding conductor 106. Thus, the interference by unnecessary electromagnetic waves in the active antenna oscillator can be suppressed so as to provide a stable oscillator with fewer malfunctions.

Example 3

An example 3 according to the present invention will now be described. The example 3 is a modification of the example 1. More specifically, it is a modification regarding a bias applying method to the gain part 101. Hence, the description of parts duplicated with the example 1 is omitted.

Figure 3A:
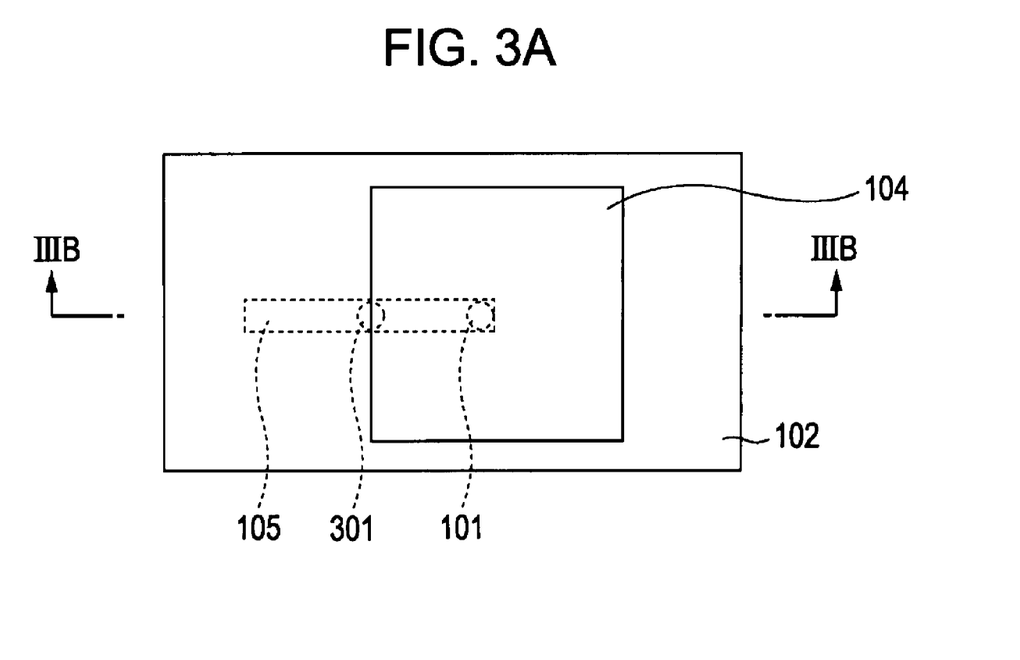
FIGS. 3A and 3B are drawings illustrating an example 3 of the present invention.
Figure 3B:
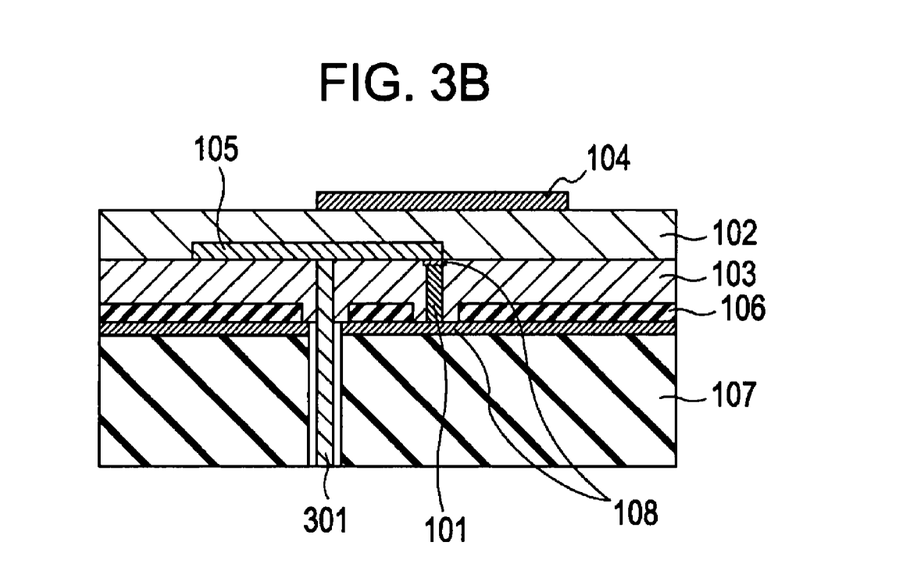

FIGS. 3A and 3B show the configuration of an active antenna oscillator in the example 3, wherein FIG. 3A is a plan view and FIG. 3B is a sectional view at the broken line IIIB-IIIB'. In FIGS. 3A and 3B, the point different from the example 1 is that the bias applying to the gain part 101 is executed by a penetration conductor 301 that penetrates a material part.

By this configuration, the bias applied to the active antenna oscillator in the example 3 can be executed from the backside of the dielectric substrate 107. As a result, unnecessary electromagnetic wave components in the bias applying part are absorbed by the grounding conductor 106. That is, the interference by unnecessary electromagnetic waves in the active antenna oscillator can be suppressed so as to provide a stable oscillator with fewer malfunctions. Also, by fabricating the bias applying part in the film thickness direction, the circuit scale of the oscillator can be miniaturized. Hence, when an array type oscillator is formed in that a plurality of the active antenna oscillators in the example 3 are juxtaposed, the degree of freedom in layout is effectively improved.

In the configuration of the example 3, the bias circuit to the oscillator is formed in the arranging direction (stacking direction) of the resonators by including a penetration electrode. By this configuration, when arraying the oscillators in the example 3, the oscillators can be connected together in a shortest route without routing the bias circuit. Therefore, the propagation loss of electromagnetic waves due to the bias circuit can be suppressed so as to provide a high-efficient oscillator. Also, by forming the bias circuit in the arranging direction of the resonators due to the penetration electrode, the degree of freedom in layout is improved.

Example 4

An example 4 according to the present invention will now be described. The example 4 is a modification of the example 2. It is a modification regarding a bias applying method to the gain part 101. Hence, the description of parts duplicated with the example 2 is omitted.

Figure 4A:
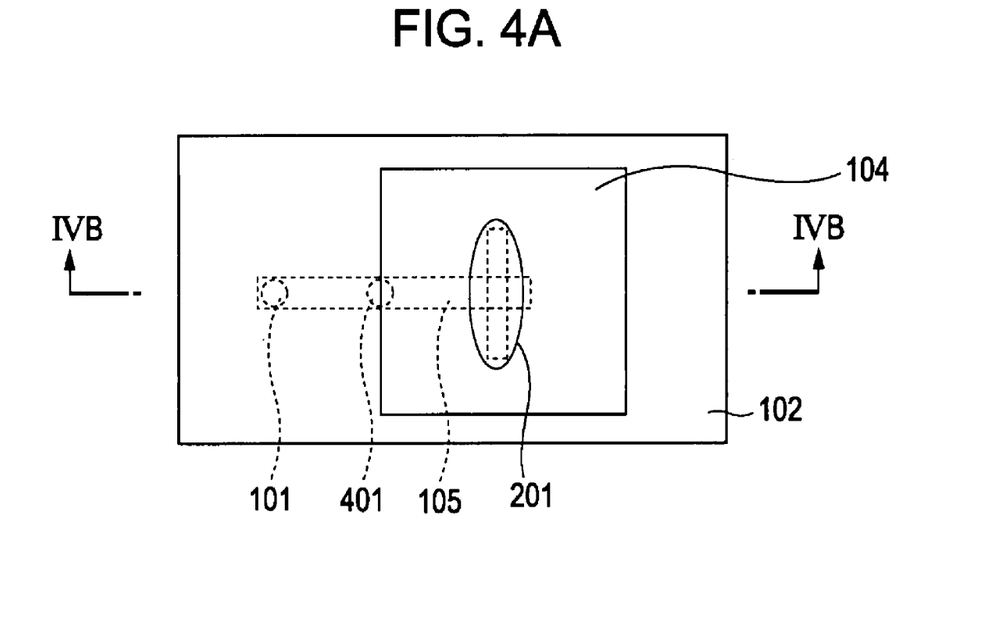
FIGS. 4A and 4B are drawings illustrating an example 4 of the present invention.
Figure 4B:
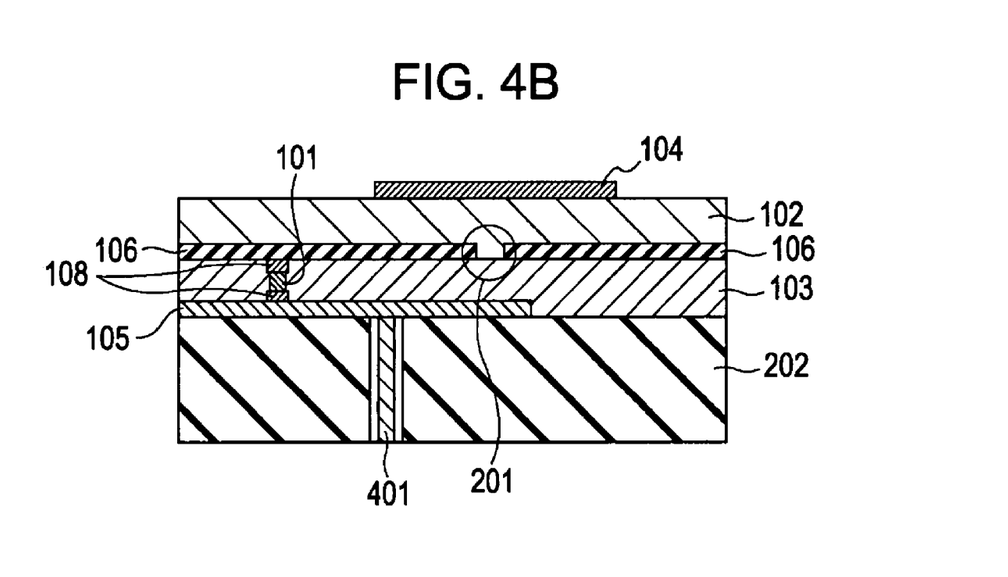

FIGS. 4A and 4B show the configuration of an active antenna oscillator in the example 4, wherein FIG. 4A is a plan view and FIG. 4B is a sectional view at the broken line E-E'.

In FIGS. 4A and 4B, the point different from the example 2 is that the bias applied to the gain part 101 is executed by a penetration conductor 401. By this configuration, the bias applied to the active antenna oscillator can be executed from the backside of the support substrate 202. As a result, in the same way as in the example 3, the circuit scale of the oscillator can be miniaturized. Hence, when an array type oscillator is formed in that a plurality of the active antenna oscillators are juxtaposed, the degree of freedom in layout is effectively improved.

Example 5

An example 5 according to the present invention will now be described. The example 5 is a modification of the example 1. More in detail, the example 5 relates to another configuration of the method for an electromagnetic connection between the first resonator and the second resonator. The description of parts duplicated with the example 1 is omitted.

Figure 9A:
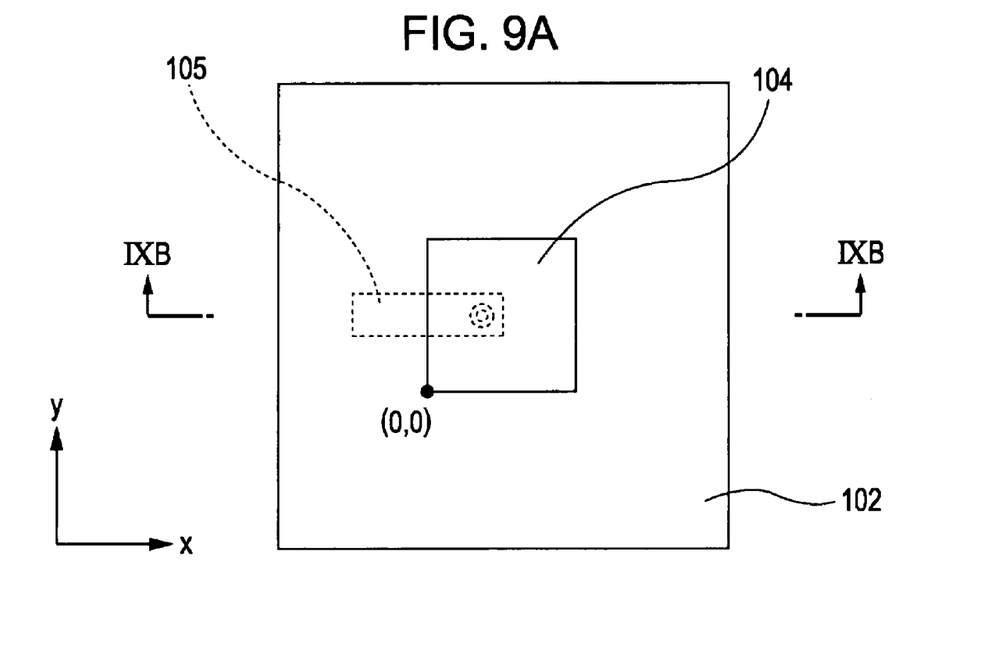
FIGS. 9A and 9B are drawings illustrating an example 5 of the present invention.
Figure 9B:
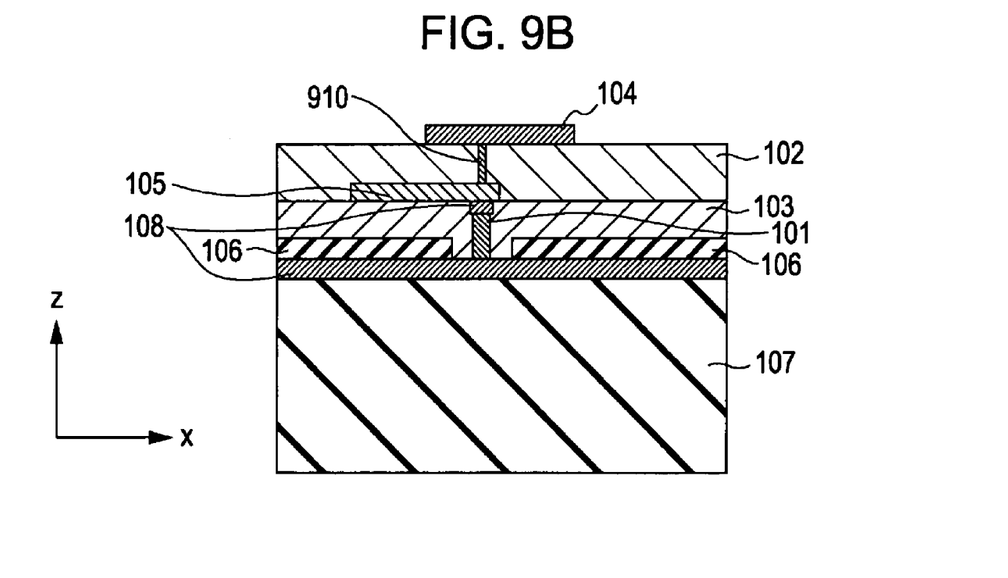

FIGS. 9A and 9B show the configuration of an active antenna oscillator in the example 5, wherein FIG. 9A is a plan view and FIG. 9B is a sectional view at the broken line F-F'. In FIGS. 9A and 9B, the bias applying unit 109 described in the example 1 is omitted. In the example 5, in the same way as in the example 1, it is preferable that the connection point of the bias applying unit 109 be located at a nodal position of the electromagnetic field distribution (position where the electric field is zero). Also, in the same way as in the example 3, the bias applied to the gain part may also be executed by a penetration conductor that penetrates a material part.

In FIGS. 9A and 9B, the point different from the example 1 is that the first conductor 105 constituting the first resonator and the second conductor 104 constituting the second resonator are connected together with an adjustment conductor 910. In the configuration of the example 1, the first resonator and the second resonator are connected together with a capacitor component (capacitive component) being parasitic on between the first conductor 105 and the second conductor 104. Whereas, in the example 5, the first resonator and the second resonator are connected together by adding an inductor component obtained from the adjustment conductor 910 to the capacitor component.

Depending on phase characteristics of the gain part 101 and the resonators, the phase condition may be adjusted by the inductor component effectively rather than by the capacitor component. In the example 5, by increasing the number of parameters for adjusting the phase condition, such situations may be coped with. Hence, the shape (sectional shape in many cases) and arrangement of the adjustment conductor 910 vary in accordance with the phase amount to be adjusted.

In FIGS. 9A and 9B, the shape of the adjustment conductor 910 is shown to be columnar; however, the shape is not limited to this, so that the cross-sectional shape may be polygonal, or it may also be tapered in the film thickness direction of the second dielectric part 102. Alternatively, the tapered shape may be polygonal (a shape in that the cone angle varies in the film thickness direction, for example). Also, part of the adjustment conductor 910 may be discontinuously shaped (a shape in that part in the film thickness direction of the second dielectric part 102 includes cavities, for example). By such configurations, more fine adjustment may also be possible.

In the example 5, the end face of the adjustment conductor 910 is exposed from the boundary surface of the second dielectric part 102. Thus, this exposed portion may also be used as an alignment marker for arranging the second conductor 104.

As described above, in the example 5, the number of parameters matching the phase for oscillating can be increased by the adjustment conductor 910, so that the degree of freedom in phase matching is improved, stabilizing the oscillation operation.

Example 6

An example 6 according to the present invention will now be described. The example 6 is a modification of the example 5. The description of parts duplicated with the example 5 is omitted.

Figure 10A:
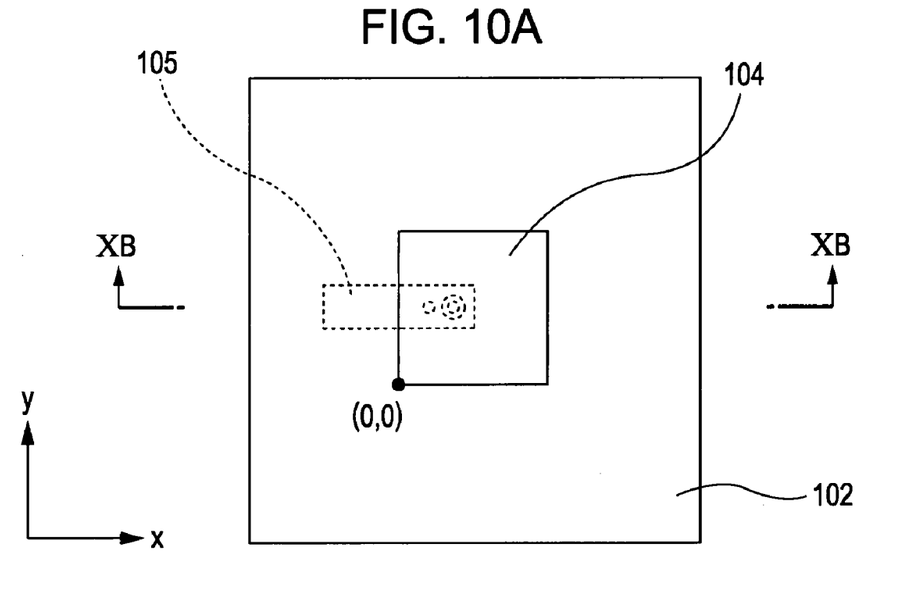
FIGS. 10A and 10B are drawings illustrating an example 6 of the present invention.
Figure 10B:
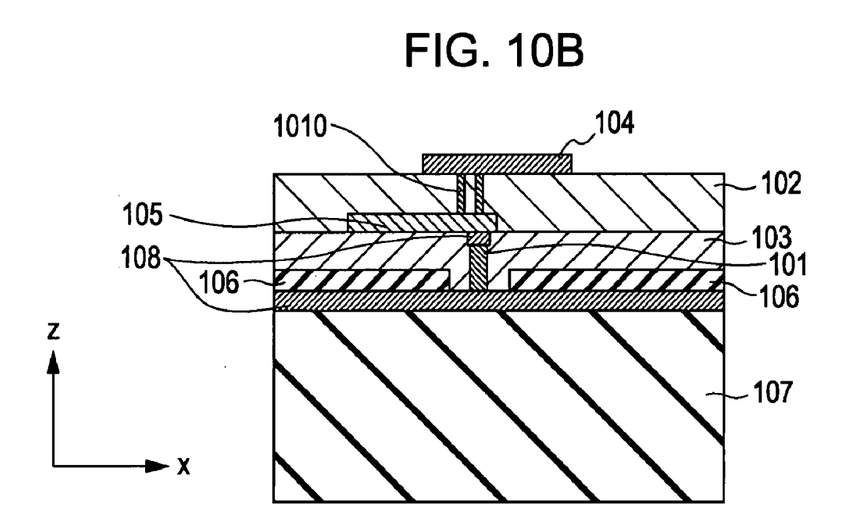

FIGS. 10A and 10B show the configuration of an active antenna oscillator in the example 6, wherein FIG. 10A is a plan view and FIG. 10B is a sectional view at the broken line G-G'. In the example 6, in the same way as in the example 5, the description of a bias applying part is also omitted.

In FIGS. 10A and 10B, the point different from the example 5 is that an adjustment conductor 1010 includes a plurality of conductors. Thereby, an inductor component obtained from the conductors of the adjustment conductor 1010 can be added to the capacitor component being parasitic on between the first conductor 105 and the second conductor 104. Furthermore, a second capacitor component being parasitic on between the conductors of the adjustment conductor 1010 may also be added thereto. The inductor component and the second capacitor component vary with the number of and the space between the conductors constituting the adjustment conductor 1010. The conductors of the adjustment conductor 1010 may also be shaped in various ways in the same way as in the example 5.

In the example 6, the end face of the adjustment conductor 1010 is also exposed from the boundary surface of the second dielectric part 102. Thus, this exposed portion may also be used as an alignment marker for arranging the second conductor 104.

As described above, in the example 6, the number of parameters matching the phase for oscillating can be further increased by the adjustment conductor 1010, so that the degree of freedom in phase matching is improved, stabilizing the oscillation operation.

Example 7

An example 7 according to the present invention will be described. The example 7 is a modification of the examples 2 and 5. The description of parts duplicated with the examples 2 and 5 is omitted.

Figure 11A:
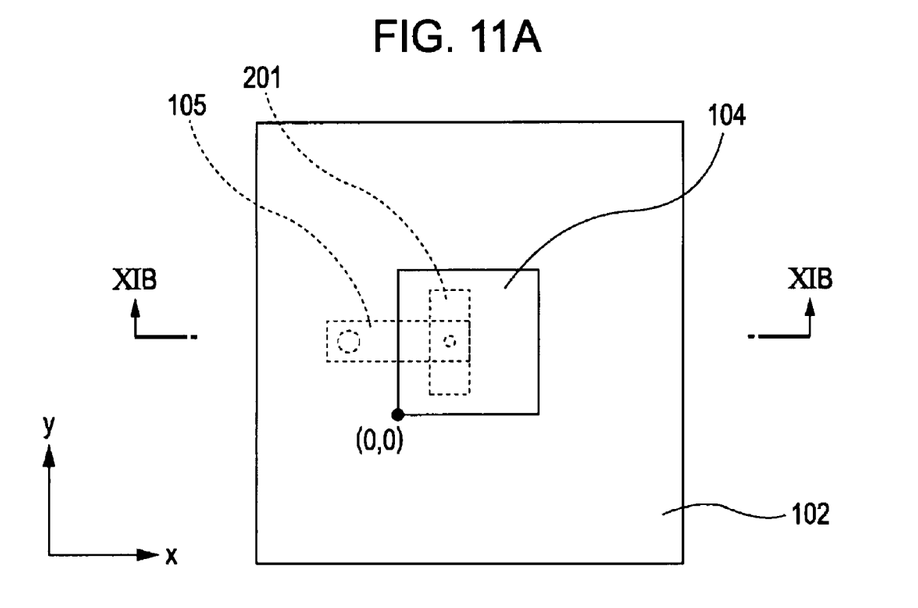
FIGS. 11A and 11B are drawings illustrating an example 7 of the present invention.
Figure 11B:
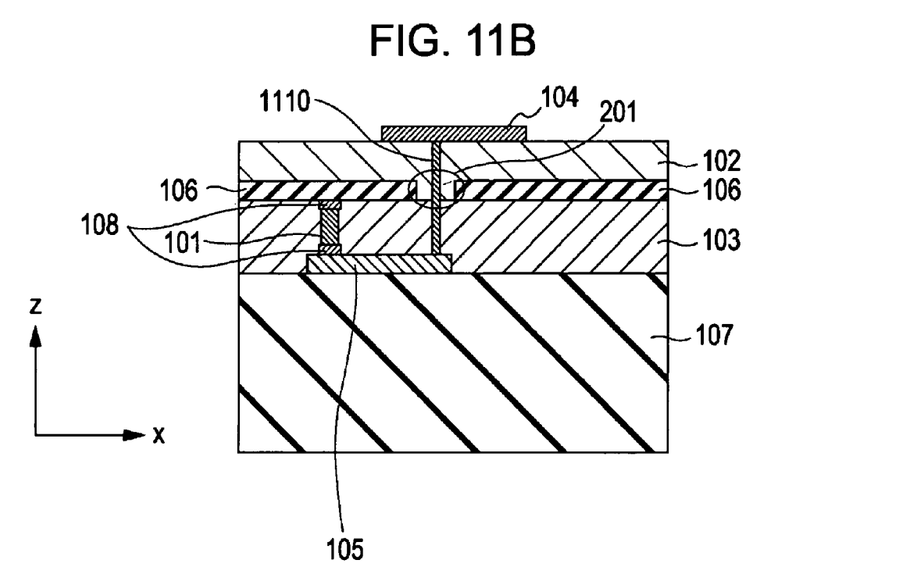

FIGS. 11A and 11B show the configuration of an active antenna oscillator in the example 7, wherein FIG. 11A is a plan view and FIG. 11B is a sectional view at the broken line H-H'. In the example 7, in the same way as in the example 5, the description of a bias applying part (the same configuration as in the examples 2 and 4) is also omitted.

In FIGS. 11A and 11B, the point different from the example 5 is that an adjustment conductor 1110 is configured to penetrate the first dielectric part 103 and the second dielectric part 102. The first conductor 105 and the second conductor 104 are electromagnetically connected together with the grounding conductor 106, the slot part 201 (the same configuration as in the examples 2 and 4), and the adjustment conductor 1110 therebetween.

The positional relationship between the slot part 201 and the adjustment conductor 1110 varies with the phase state to be adjusted. For example, as shown in FIGS. 11A and 11B, the adjustment conductor 1110 may exist in the cavity of the slot part 201 or the adjustment conductor 1110 may be separated therefrom. When the slot part 201 is separated from the adjustment conductor 1110, the penetration part in the grounding conductor 106 is insulated (a cavity is provided so as to insert the adjustment conductor 1110 thereinto, for example, for dividing the potential of the adjustment conductor 1110 from that of the grounding conductor 106). The conductors of the adjustment conductor 1010 may also be shaped in various ways in the same way as in the example 5.

The adjustment conductor 1110 may be shaped in various ways in the same way as in the example 5. In the example 7, the end face of the adjustment conductor 1110 is also exposed from the boundary surface of the second dielectric part 102. Thus, this exposed portion may also be used as an alignment marker for arranging the second conductor 104.

As described above, in the example 7, the number of parameters matching the phase for oscillating can be further increased by the adjustment conductor 1110, so that the degree of freedom in phase matching is improved, stabilizing the oscillation operation. Furthermore, by controlling the electromagnetically integrated state through the slot part 201, electromagnetic wave components generated at positions other than the slot part 201 are absorbed by the grounding conductor 106. Thus, the interference by unnecessary electromagnetic waves in the active antenna oscillator can be suppressed so as to provide a stable oscillator with fewer malfunctions.

Example 8

An example 8 according to the present invention will now be described. The example 8 is a modification of the example 7. The description of parts duplicated with the above examples is omitted.

Figure 12A:
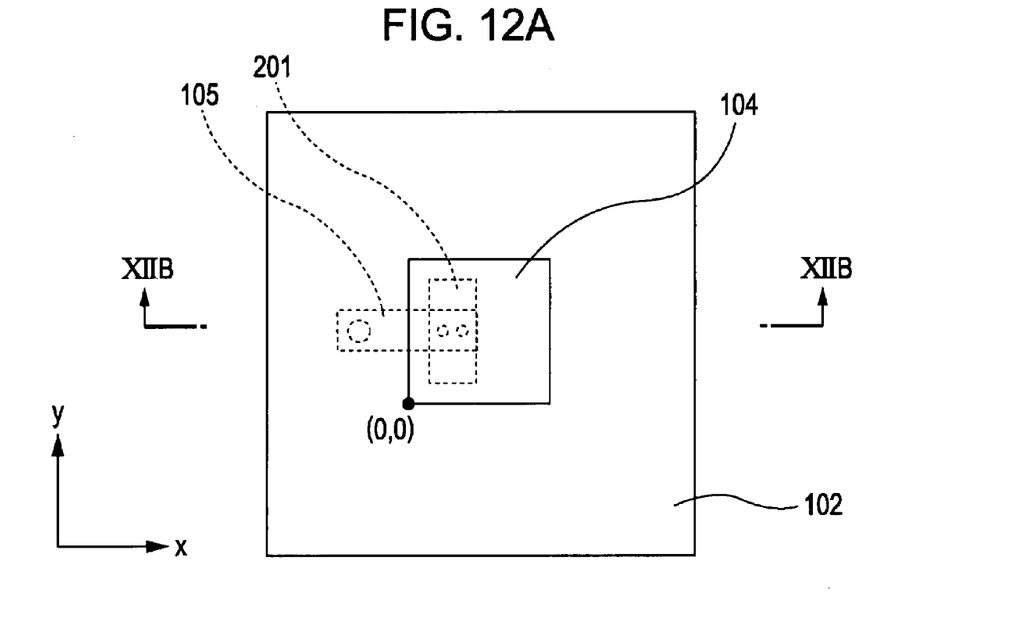
FIGS. 12A and 12B are drawings illustrating an example 8 of the present invention.
Figure 12B:
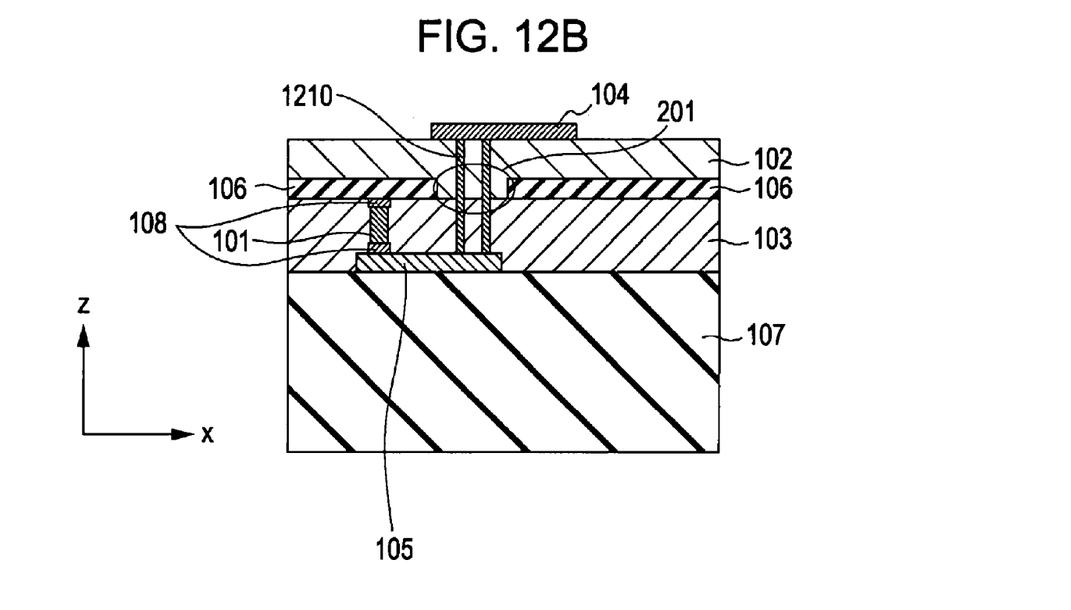

FIGS. 12A and 12B show the configuration of an active antenna oscillator in the example 8, wherein FIG. 12A is a plan view and FIG. 12B is a sectional view at the broken line I-I'. In the example 8, in the same way as in the example 7, the description of a bias applying part (the same configuration as in the examples 2 and 4) is also omitted.

In FIGS. 12A and 12B, the point different from the example 7 is that an adjustment conductor 1210 is composed of a plurality of conductors in the same way as in the example 6. Thereby, the number of parameters for matching the phase can be further increased with the number of and the space between the conductors, in the same way as in the example 6.

Each conductor constituting the adjustment conductor 1210 may be shaped in various ways in the same way as in the example 5. The positional relationship between the slot part 201 and the adjustment conductor 1210 also varies in the same way as in the example 7. In the example 8, all the conductors constituting the adjustment conductor 1210 may exist within the slot part 201 or may be separated therefrom. Furthermore, part of the conductors constituting the adjustment conductor 1210 may exist within the slot part 201 while another part may be separated therefrom.

In the example 8, the end face of the adjustment conductor 1210 is also exposed from the boundary surface of the second dielectric part 102. Thus, this exposed portion may also be used as an alignment marker for arranging the second conductor 104.

As described above, in the example 8, the number of parameters matching the phase for oscillating can be further increased by the adjustment conductor 1210, so that the degree of freedom in phase matching is improved. Furthermore, by controlling the electromagnetically integrated state through the slot part 201, electromagnetic wave components generated at positions other than the slot part 201 are absorbed by the grounding conductor 106. Thus, the interference by unnecessary electromagnetic waves in the active antenna oscillator can be suppressed so as to provide a stable oscillator with fewer malfunctions.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-150922 filed May 31, 2006 and No. 2006-297307 filed Nov. 1, 2006, which are hereby incorporated by reference herein in their entirety.

What is claimed is:

1. An antenna oscillator, comprising:
a first strip line type resonator fabricated by stacking a first open stub type strip conductor onto a grounding conductor defining a reference potential of each part with a first dielectric part therebetween, the first dielectric part having a gain part with a gain over electromagnetic waves to be oscillated; and
a second resonator fabricated by stacking a second conductor, emitting electromagnetic waves to the exterior, onto the first resonator with a second dielectric part therebetween so as to function as an antenna by the configuration between the grounding conductor and the second conductor,
wherein the first conductor of the first resonator and the second conductor of the second resonator are separated from each other in a stacking direction with the second dielectric part therebetween, and
wherein the first resonator and the second resonator are electromagnetically connected together so as to form a resonance circuit that makes the electromagnetic waves oscillate,
wherein the electromagnetic waves include terahertz waves, and
wherein one end of the gain part is connected to the first conductor and the other end of the gain part is identical to the grounding conductor in potential.

2. The oscillator according to claim 1, wherein the first resonator is accumulated directly under the second conductor so as to be electromagnetically connected to the second resonator, and
wherein the first resonator is arranged so as to satisfy oscillating start conditions of the oscillator by adjusting the electromagnetic connection.

3. The oscillator according to claim 1, further comprising a bias applying part applying a bias to the gain part,
wherein the bias applying part is connected to the first conductor with a penetration electrode penetrating a material part, and
wherein the penetration electrode is arranged by extending in an arranging direction of the first resonator and the second resonator.

4. The oscillator according to claim 3, wherein the penetration electrode is arranged at a nodal position of the electromagnetic field distribution in the first conductor.

5. The oscillator according to claim 1, wherein the grounding conductor includes a slot part and the first resonator and the second resonator are separated from each other in a stacking direction with the slot part therebetween.

6. The oscillator according to claim 1, wherein the gain part includes a resonant tunneling diode.

7. The oscillator according to claim 1,
wherein the first conductor of the first resonator and the second conductor of the second resonator are connected together with one or a plurality of adjustment conductors formed in the second dielectric part, and
wherein the first resonator and the second resonator are electromagnetically connected together so as to form a resonance circuit making the electromagnetic waves oscillate.

8. The oscillator according to claim 7, wherein the first resonator is accumulated directly under the second conductor so as to be electromagnetically connected to the second resonator with the adjustment conductor therebetween, and
wherein the arrangement of the first resonator and the conformation of the adjustment conductor are established so as to satisfy oscillating start conditions of the oscillator by adjusting the electromagnetic connection.

9. The oscillator according to claim 7, wherein the grounding conductor includes a slot part, and the first resonator and the second resonator are arranged in the stacking direction with the slot part and the adjustment conductor therebetween.

10. A manufacturing method for manufacturing the antenna oscillator according to claim 1, the method comprising the steps of:
monitoring the oscillation state of the antenna oscillator; and
adjusting components of the first resonator and the second resonator so as to satisfy desired oscillation conditions while monitoring the oscillation state.

11. An antenna oscillator, comprising:
a first strip line type resonator fabricated by stacking a first open stub type strip conductor onto a grounding conductor defining a reference potential of each part with a first dielectric part therebetween, the first dielectric part having a gain part with a gain over electromagnetic waves to be oscillated; and
a second resonator fabricated by stacking a second conductor, emitting electromagnetic waves to the exterior, onto the first resonator with a second dielectric part therebetween so as to function as an antenna by the configuration between the grounding conductor and the second conductor,
wherein the first conductor of the first resonator and the second conductor of the second resonator are separated from each other in a stacking direction with the second dielectric part and the grounding conductor therebetween,
wherein the first resonator and the second resonator are electromagnetically connected together so as to form a resonance circuit that makes the electromagnetic waves oscillate,
wherein the electromagnetic waves include terahertz waves, and
wherein one end of the gain part is connected to the first conductor and the other end of the gain part is identical to the grounding conductor in potential.

* * * * *